United States Patent
Yu et al.

(10) Patent No.: US 8,874,630 B2
(45) Date of Patent: Oct. 28, 2014

(54) APPARATUS AND METHOD FOR CONVERTING DATA BETWEEN A FLOATING-POINT NUMBER AND AN INTEGER

(75) Inventors: Hyeong-Seok Yu, Seoul (KR); Suk-Jin Kim, Seoul (KR); Sang-Su Park, Chungcheongnam-do (KR); Yong-Surk Lee, Seoul (KR)

(73) Assignees: Samsung Electronics Co., Ltd., Suwon-si (KR); Industry-Academic Cooperation Foundation, Yonsei University, Seoul (KR)

( * ) Notice: Subject to any disclaimer, the term of this patent is extended or adjusted under 35 U.S.C. 154(b) by 647 days.

(21) Appl. No.: 13/101,356

(22) Filed: May 5, 2011

(65) Prior Publication Data

US 2012/0124116 A1 May 17, 2012

(30) Foreign Application Priority Data

Nov. 17, 2010 (KR) ........................ 10-2010-0114565

(51) Int. Cl.
*G06F 7/00* (2006.01)
*G06F 7/483* (2006.01)
*H03M 7/24* (2006.01)

(52) U.S. Cl.
CPC *G06F 7/483* (2013.01); *H03M 7/24* (2013.01)
USPC ........................................................ 708/204

(58) Field of Classification Search
CPC ...... H03M 7/24; G06F 9/30025; G06F 7/572; G06F 7/4876; G06F 7/491

USPC ........................................................ 708/204
See application file for complete search history.

(56) References Cited

U.S. PATENT DOCUMENTS

| 5,257,215 | A | 10/1993 | Poon |
| 5,561,615 | A | 10/1996 | Kuo et al. |
| 5,684,729 | A | 11/1997 | Yamada et al. |
| 6,510,446 | B1 | 1/2003 | Fukagawa |
| 6,523,050 | B1 * | 2/2003 | Dhablania et al. ............ 708/204 |
| 6,535,898 | B1 | 3/2003 | Yuval |
| 7,774,393 | B1 | 8/2010 | Brooks et al. |

FOREIGN PATENT DOCUMENTS

| JP | 02-267625 | 11/1990 |
| JP | 03-040129 | 2/1991 |
| JP | 05-100822 | 4/1993 |
| JP | 05-173759 | 7/1993 |
| JP | 08-202530 | 8/1996 |
| JP | 2000-347832 | 12/2000 |

* cited by examiner

*Primary Examiner* — Tan V. Mai
(74) *Attorney, Agent, or Firm* — NSIP Law (57) ABSTRACT

An apparatus and method for converting data between a floating-point number and an integer is provided. The apparatus includes a data converter configured to determine a sign of input binary data and an output format to which to convert the input binary data and convert the input binary data into a one's complement number based on the sign and the output format of the input binary data, a bias value generator configured to determine whether the input binary data has been rounded up based on a rounding mode of the input binary data and generate a bias value accordingly; and an adder configured to convert the input binary data into a two's complement number by adding the one's complement number and the bias value.

18 Claims, 11 Drawing Sheets

| | FLOATING-POINT NUMBER → INTEGER | | | | | |
|---|---|---|---|---|---|---|
| | POSITIVE(+) | | | NEGATIVE(-) | | |
| ROUNDING BIT /STICKY BIT | ONE'S COMPLEMENT OF INPUT BINARY DATA | ROUNDING MODE (ROUND TO POSITIVE INFINITY) | BIAS VALUE | ONE'S COMPLEMENT OF INPUT BINARY DATA | ROUNDING MODE (ROUND TO POSITIVE INFINITY) | BIAS VALUE |
| 00 | 0001 | 0001 | 0 | 1110 | 1111 | 1 |
| 01 | 0001 | 0010 | 1 | 1110 | 1111 | 1 |
| 10 | 0001 | 0010 | 1 | 1110 | 1111 | 1 |
| 11 | 0001 | 0010 | 1 | 1110 | 1111 | 1 |

FIG. 3B

| ROUNDING BIT /STICKY BIT | FLOATING-POINT NUMBER → INTEGER ||||||
|---|---|---|---|---|---|---|
| | POSITIVE(+) ||| NEGATIVE(-) |||
| | ONE'S COMPLEMENT OF INPUT BINARY DATA | ROUNDING MODE (ROUND TO NEGATIVE INFINITY) | BIAS VALUE | ONE'S COMPLEMENT OF INPUT BINARY DATA | ROUNDING MODE (ROUND TO NEGATIVE INFINITY) | BIAS VALUE |
| 00 | 0001 | 0001 | 0 | 1110 | 1111 | 1 |
| 01 | 0001 | 0001 | 0 | 1110 | 1110 | 0 |
| 10 | 0001 | 0001 | 0 | 1110 | 1110 | 0 |
| 11 | 0001 | 0001 | 0 | 1110 | 1110 | 0 |

FIG. 3C

| | FLOATING-POINT NUMBER → INTEGER | | | | | |
|---|---|---|---|---|---|---|
| | POSITIVE(+) | | | NEGATIVE(-) | | |
| ROUNDING BIT /STICKY BIT | ONE'S COMPLEMENT OF INPUT BINARY DATA | ROUNDING MODE (ROUND TO ZERO) | BIAS VALUE | ONE'S COMPLEMENT OF INPUT BINARY DATA | ROUNDING MODE (ROUND TO ZERO) | BIAS VALUE |
| 00 | 0001 | 0001 | 0 | 1110 | 1111 | 1 |
| 01 | 0001 | 0001 | 0 | 1110 | 1111 | 1 |
| 10 | 0001 | 0001 | 0 | 1110 | 1111 | 1 |
| 11 | 0001 | 0001 | 0 | 1110 | 1111 | 1 |

FIG. 3D

| | FLOATING-POINT NUMBER → INTEGER | | | | | |
|---|---|---|---|---|---|---|
| | POSITIVE(+) | | | NEGATIVE(−) | | |
| ROUNDING BIT /STICKY BIT | ONE'S COMPLEMENT OF INPUT BINARY DATA | ROUNDING MODE (ROUND TO NEAREST EVEN) | BIAS VALUE | ONE'S COMPLEMENT OF INPUT BINARY DATA | ROUNDING MODE (ROUND TO NEAREST EVEN) | BIAS VALUE |
| 00 | 0001 | 0001 | 0 | 1110 | 1111 | 1 |
| 01 | 0001 | 0001 | 0 | 1110 | 1111 | 1 |
| 10 | 0001 | 0010 | 1 | 1110 | 1110 | 0 |
| 11 | 0001 | 0010 | 1 | 1101 | 1110 | 0 |
| 00 | 0010 | 0010 | 0 | 1101 | 1110 | 1 |
| 01 | 0010 | 0010 | 0 | 1101 | 1110 | 1 |
| 10 | 0010 | 0010 | 0 | 1101 | 1110 | 1 |
| 11 | 0010 | 0011 | 1 | 1101 | 1101 | 0 |

FIG. 3E

| | FLOATING-POINT NUMBER → INTEGER ||||
| ROUNDING BIT /STICKY BIT | POSITIVE(+) || NEGATIVE(−) ||
| | ONE'S COMPLEMENT OF INPUT BINARY DATA | ROUNDING MODE (ROUND TO POSITIVE INFINITY) | BIAS VALUE | ONE'S COMPLEMENT OF INPUT BINARY DATA | ROUNDING MODE (ROUND TO POSITIVE INFINITY) | BIAS VALUE |
| --- | --- | --- | --- | --- | --- | --- |
| 00 | 0001 | 0001 | 0 | 0001 | 0001 | 0 |
| 01 | 0001 | 0010 | 1 | 0001 | 0001 | 0 |
| 10 | 0001 | 0010 | 1 | 0001 | 0001 | 0 |
| 11 | 0001 | 0010 | 1 | 0001 | 0001 | 0 |

FIG. 3F

| ROUNDING BIT /STICKY BIT | FLOATING-POINT NUMBER → INTEGER ||||||
| --- | --- | --- | --- | --- | --- | --- |
| | POSITIVE(+) ||| NEGATIVE(−) |||
| | ONE'S COMPLEMENT OF INPUT BINARY DATA | ROUNDING MODE (ROUND TO NEGATIVE INFINITY) | BIAS VALUE | ONE'S COMPLEMENT OF INPUT BINARY DATA | ROUNDING MODE (ROUND TO NEGATIVE INFINITY) | BIAS VALUE |
| 00 | 0001 | 0001 | 0 | 0001 | 0001 | 0 |
| 01 | 0001 | 0001 | 0 | 0001 | 0010 | 1 |
| 10 | 0001 | 0001 | 0 | 0001 | 0010 | 1 |
| 11 | 0001 | 0001 | 0 | 0001 | 0010 | 1 |

FIG. 3G

| ROUNDING BIT /STICKY BIT | FLOATING-POINT NUMBER → INTEGER ||||
| | POSITIVE(+) || NEGATIVE(-) ||
| | ONE'S COMPLEMENT OF INPUT BINARY DATA | ROUNDING MODE (ROUND TO ZERO) | BIAS VALUE | ONE'S COMPLEMENT OF INPUT BINARY DATA | ROUNDING MODE (ROUND TO ZERO) | BIAS VALUE |
| --- | --- | --- | --- | --- | --- | --- |
| 00 | 0001 | 0001 | 0 | 0001 | 0001 | 0 |
| 01 | 0001 | 0001 | 0 | 0001 | 0001 | 0 |
| 10 | 0001 | 0001 | 0 | 0001 | 0001 | 0 |
| 11 | 0001 | 0001 | 0 | 0001 | 0001 | 0 |

FIG. 3H

| | FLOATING-POINT NUMBER → INTEGER | | | | |
|---|---|---|---|---|---|
| | POSITIVE(+) | | | NEGATIVE(−) | |
| ROUNDING BIT /STICKY BIT | ONE'S COMPLEMENT OF INPUT BINARY DATA | ROUNDING MODE (ROUND TO NEAREST EVEN) | BIAS VALUE | ONE'S COMPLEMENT OF INPUT BINARY DATA | ROUNDING MODE (ROUND TO NEAREST EVEN) | BIAS VALUE |
| 00 | 0001 | 0001 | 0 | 0001 | 0001 | 0 |
| 01 | 0001 | 0001 | 0 | 0001 | 0001 | 0 |
| 10 | 0001 | 0010 | 1 | 0001 | 0010 | 1 |
| 11 | 0001 | 0010 | 1 | 0001 | 0010 | 1 |
| 00 | 0010 | 0010 | 0 | 0010 | 0010 | 0 |
| 01 | 0010 | 0010 | 0 | 0010 | 0010 | 0 |
| 10 | 0010 | 0010 | 0 | 0010 | 0010 | 0 |
| 11 | 0010 | 0011 | 1 | 0010 | 0011 | 1 |

FIG. 4

APPARATUS AND METHOD FOR CONVERTING DATA BETWEEN A FLOATING-POINT NUMBER AND AN INTEGER

CROSS-REFERENCE TO RELATED APPLICATION(S)

This application claims the benefit under 35 U.S.C. §119 (a) of Korean Patent Application No. 10-2010-0114565, filed on Nov. 17, 2010, in the Korean Intellectual Property Office, the entire disclosure of which is incorporated herein by reference for all purposes.

BACKGROUND

1. Field

The following description relates to the conversion of binary data, and, more particularly, to an apparatus and method capable of incorporating rounding and two's complementation during the conversion of data.

2. Description of the Related Art

In computing, binary data is used to represent various numeric values using different combinations of ones and zeros. Binary data can be represented in various formats. For example, floating-point units (FPUs) process binary data represented in a floating-point number format. Thus, in order for FPUs to process binary data represented in an integer or fixed-point number format, the binary data needs to be converted into a floating-point number.

Floating-point binary data is represented as a sign magnitude number, in which the most significant bit indicates whether the represented value is positive or negative, whereas integer binary data or fixed-point binary data is represented as a two's complement number, which allows for simple addition of values by encoding negative numbers into ordinary binary. Therefore, in order to convert binary data between a floating-point number and an integer, a rounding module and a two's complement module are both required. For example, a floating-point number is converted into a two's complement integer by adding one to the floating-point number if the floating-point number is rounded up, and adding one to the one's complement of the floating-point number.

Conventionally, two adders (i.e., one adder for adding one to a floating-point number if the floating-point number is rounded up and the other for adding one to the one's complement of the floating-point number) are required to realize a floating-point number-to-integer converter.

SUMMARY

The following description relates to an apparatus and method for converting data between a floating-point number and an integer, which effectively incorporates rounding and two's complementation during the conversion of data between a floating-point number and an integer.

In one general aspect, there is provided an apparatus for converting data between a floating-point number and an integer, the apparatus including a data converter configured to determine a sign of input binary data and an output format to which to convert the input binary data and convert the input binary data into a one's complement number based on the sign and the output format of the input binary data, a bias value generator configured to determine whether the input binary data has been rounded up based on a rounding mode of the input binary data and generate a bias value accordingly, and an adder configured to convert the input binary data into a two's complement number by adding the one's complement number and the bias value.

The data converter may be further configured to convert the input binary data into the one's complement number in response to the output format of the input binary data being a negative integer format.

The bias value generator may include a rounding information generator configured to generate rounding information on the input binary data based on the sign, the output format, and the rounding mode of the input binary data and rounding and sticky bits of the input binary data, and a bias value calculator configured to calculate the bias value based on the rounding information.

The apparatus may further include an overflow information generator configured to generate overflow information indicating whether overflow has occurred during the conversion of the input binary data.

The overflow information generator may include a bit determiner configured to determine whether bits of the input binary data are all one, an overflow determiner configured to determine whether overflow has occurred based on values of the bits of the input binary data and the rounding information.

The apparatus may further include a final data generator configured to generate final data based on the two's complement number and the overflow information.

The input binary data may be 32- or 64-bit binary data.

In another general aspect, there is provided a method of converting data between a floating-point number and an integer, the method including determining a sign of input binary data and an output format to which to convert the input binary data and convert the input binary data into a one's complement number based on the sign and the output format of the input binary data; determining whether the input binary data has been rounded up based on a rounding mode of the input binary data and generating a bias value accordingly, and converting the input binary data into a two's complement number by adding the one's complement number and the bias value.

The calculating the bias value may include generating rounding information on the input binary data based on the sign, the output format, and the rounding mode of the input binary data and rounding and sticky bits of the input binary data, and calculating the bias value based on the rounding information.

The method may further include generating overflow information indicating whether overflow has occurred during the conversion of the input binary data.

The generating the overflow information may include determining whether bits of the input binary data are all one, and determining whether overflow has occurred based on values of the bits of the input binary data and the rounding information.

The method may further include generating final data based on the two's complement number and the overflow information.

In another general aspect, there is provided an apparatus to convert input binary data, the apparatus including a data converter configured to convert the input binary data into a one's complement number, a bias value generator configured to generate a bias value of the input binary data, and an adder configured to add the one's complement number and the bias value to obtain a two's complement number.

The data converter may convert the input binary data into the one's complement number according to a sign of the input binary data and an output format to which to convert the input binary data.

The bias value generator may determine whether the input binary data has been rounded up based on a rounding mode of the input binary data, and may generate the bias value accordingly.

In another general aspect, there is provided a method of converting input binary data, the method including converting the input binary data into a one's complement number, generating a bias value of the input binary data, and adding the one's complement number and the bias value to obtain a two's complement number.

The converting of the input binary data into the one's complement number may be executed according to a sign of the input binary data and an output format to which to convert the input binary data.

The generating of the bias value may include determining whether the input binary data has been rounded up based on a rounding mode of the input binary data, and generating the bias value accordingly.

Other features and aspects may be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

Figure 1:
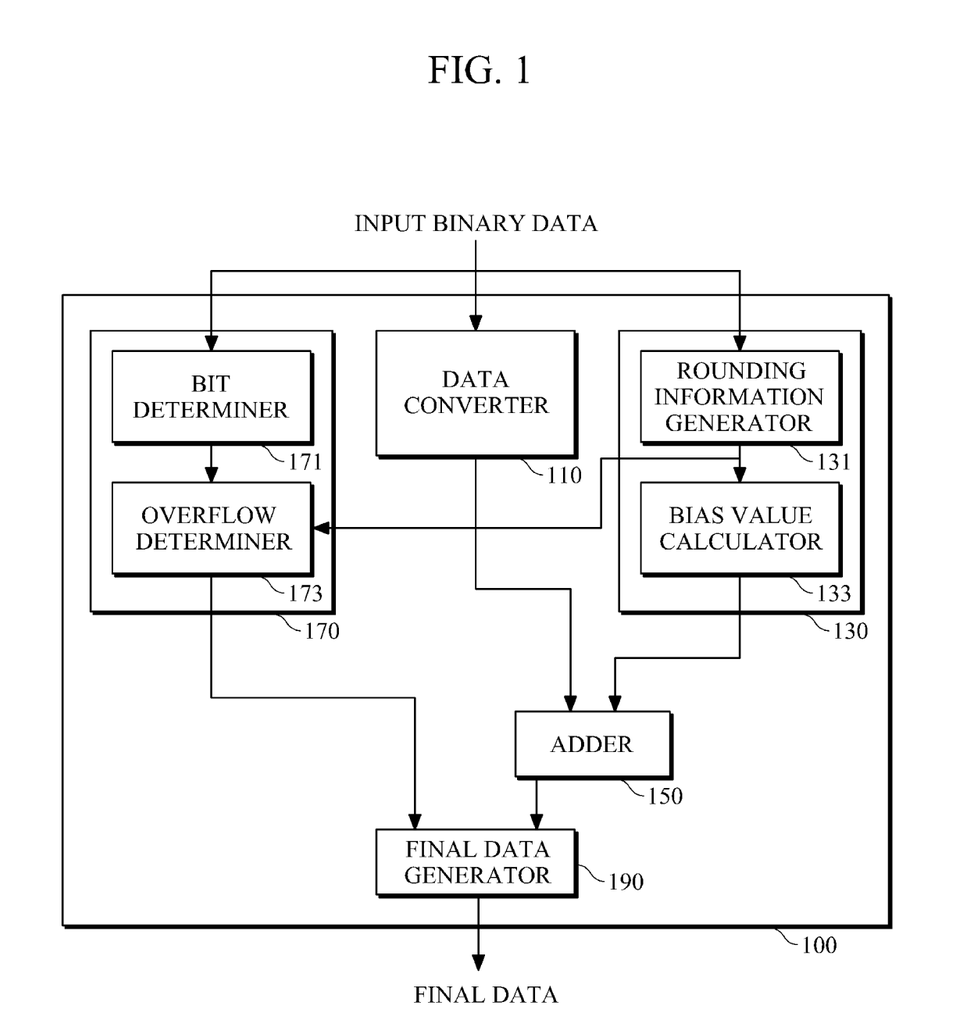
FIG. 1 is a diagram illustrating an example of an apparatus for converting data between a floating-point number and an integer.

FIG. 1 illustrates an example of an apparatus 100 for converting data between a floating-point number and an integer. Referring to FIG. 1, this example of the apparatus 100 includes a data converter 110, a bias value generator 130, an adder 150, an overflow information generator 170, and a final data generator 190.

The data converter 110 may include a logic device for calculating the one's complement of binary data. In response to input binary data being received, the data converter 110 may determine the sign of the input binary data based on a most significant bit of the input binary data, and may determine the format (hereinafter referred to as the output format) to which to convert the input binary data. The output format of the input binary data may already be determined internally. For example, if the data converter 110 is a floating-point number-to-integer converter, the input binary data may be a floating-point number, and the output format of the input binary data may be an integer format. The internal precision of the input binary data will hereinafter be described in greater detail with reference to FIG. 2.

Figure 2:
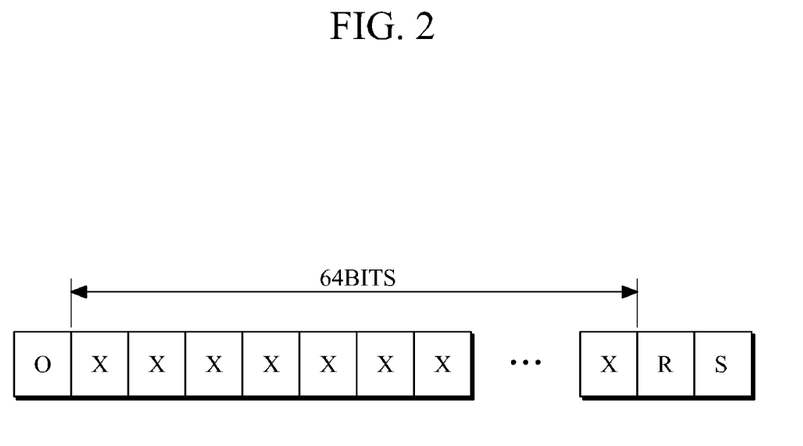
FIG. 2 is a flowchart illustrating an example of the internal precision of input binary data.

FIG. 2 illustrates an example of the internal precision of input binary data. Referring to FIG. 2, a most significant bit of the input binary data, which is the leftmost bit in this example, indicates the sign of the input binary data. If the most significant bit is 0, the input binary data is a positive number. On the other hand, if the most significant bit is one, the input binary data is a negative number. Two least significant bits of the input binary data, which are the rightmost bits in this example, are a rounding bit and a sticky bit. The rounding bit and the sticky bit are used to determine a bias value based on the sign of the input binary data and a rounding mode. The rest of the input binary data, that is, the values between the most significant bit and the two least significant bits, represents the value of the input binary data. In the example illustrated in FIG. 2, the value of the input binary data is represented by 64 bits, but other examples may employ 32 bits, and so on.

According to an IEEE 754 standard, which is an internal standard for floating-point arithmetic, a single precision number is defined as a 32-bit number, and a double precision number as a 64-bit number. Therefore, the apparatus 100 may represent the input binary data as 67 or more-bit data (including an MSB and an LSB along with the 64 bits representing the value of the number). In an example in which the input binary data is converted from a floating-point number to an integer, the input binary data may be arranged in increasing order of significance. On the other hand, in an example in which the input binary data is converted from an integer to an integer, the input binary data may be arranged in decreasing order of significance.

Referring back to FIG. 1, the data converter 110 may determine whether to convert the input binary data to a one's complement number based on the sign of the input binary data and the output format of the input binary data. If the input binary data is a floating-point number, the input binary data may be represented as a sign-magnitude value. On the other hand, if the input binary data is an integer or a fixed point number, the input binary data may be represented as a two's complement number. The sign magnitude or two's complement of the input binary data is closely related to the one's complement of the input binary data. The one's complement of a negative number may be the inverse of the sign magnitude of the negative number. For example, sign magnitude numbers of 1000, 1001, and 1010 represent integers of −0, −1, and −2, respectively, whereas one's complement numbers of 1000, 1001, and 1010 represent integers of −7, −6, and −5, respectively. In other words, although the four bits in these examples may be the same, different values are represented according to whether the input binary data are sign magnitude numbers or one's complement numbers.

The two's complement of the input binary data is obtained by adding one to the one's complement of the sign magnitude of the input binary data. For example, the one's complement of a sign magnitude number of 1010 is 0101, and the two's complement of the sign magnitude number of 1010 is 0110, which is the result of adding one to 0101. A one's complement number of 1010 represents an integer of −5, and a two's complement number of 1010 represents an integer of −6. If the input binary data needs to be converted into negative integer data, the data converter 110 may convert the input binary data to a one's complement number. That is, if the input binary data is a floating-point number, the data converter 110 needs to convert the input binary data into a one's complement number to convert the input binary data into an integer.

If the input binary data is an integer, the data converter 110 may output the input binary data to the adder 150 without converting the input binary data into a one's complement number.

The input binary data that is input into the data converter 110 is also input into the bias value generator 130. The bias value generator 130 performs rounding and includes a calculation module to calculate a bias value of the input binary data. The bias value generator 130 determines a rounding mode of the input binary data and determines whether the input binary data has been rounded up in the determined rounding mode. The bias value generator 130 generates a bias value based on information indicating whether the input binary data has been rounded up, and outputs the generated bias value to the adder 150.

The bias value generator 130 may include a rounding information generator 131 and a bias value calculator 133. The rounding information generator 131 generates rounding information on the input binary data based on the output format, the sign, the rounding mode, and the rounding and sticky bits of the input binary data. The output format and the rounding mode of the input binary data may be set in advance. Examples of the rounding mode of the input binary data include, but are not limited to, four rounding modes specified in the IEEE 754 standard.

The IEEE 754 standard defines the following four rounding modes: round to nearest, round to zero, round to positive infinity, and round to negative infinity. In the 'round to zero' mode, the input binary data is rounded to zero regardless of the rounding and sticky bits thereof. In the 'round to positive infinity' mode, the input binary data is rounded up if the input binary data is a positive number and at least one of the rounding and sticky bits of the input binary data is one. In the 'round to negative infinity' mode, the input binary data is rounded up if the input binary data is a negative number and at least one of the rounding and sticky bits of the input binary data is one.

The bias value calculator 133 may receive the rounding information on the input binary data from the rounding information generator 133. The rounding information on the input binary data includes the sign, the rounding mode, and the rounding and sticky bits of the input binary data. The bias value calculator 133 calculates a bias value based on the rounding information on the input binary data. Various bias values for various rounding modes will hereinafter be described in detail with reference to FIGS. 3A through 3H.

FIGS. 3A through 3H illustrate examples of bias value tables for various rounding modes. More specifically, FIGS. 3A through 3D illustrate examples of bias value tables for reference in the conversion of the input binary data from a floating-point number to an integer (or a fixed-point number) for the 'round to positive infinity,' 'round to negative infinity,' 'round to zero,' and 'round to nearest even' modes, respectively.

Figure 3A:
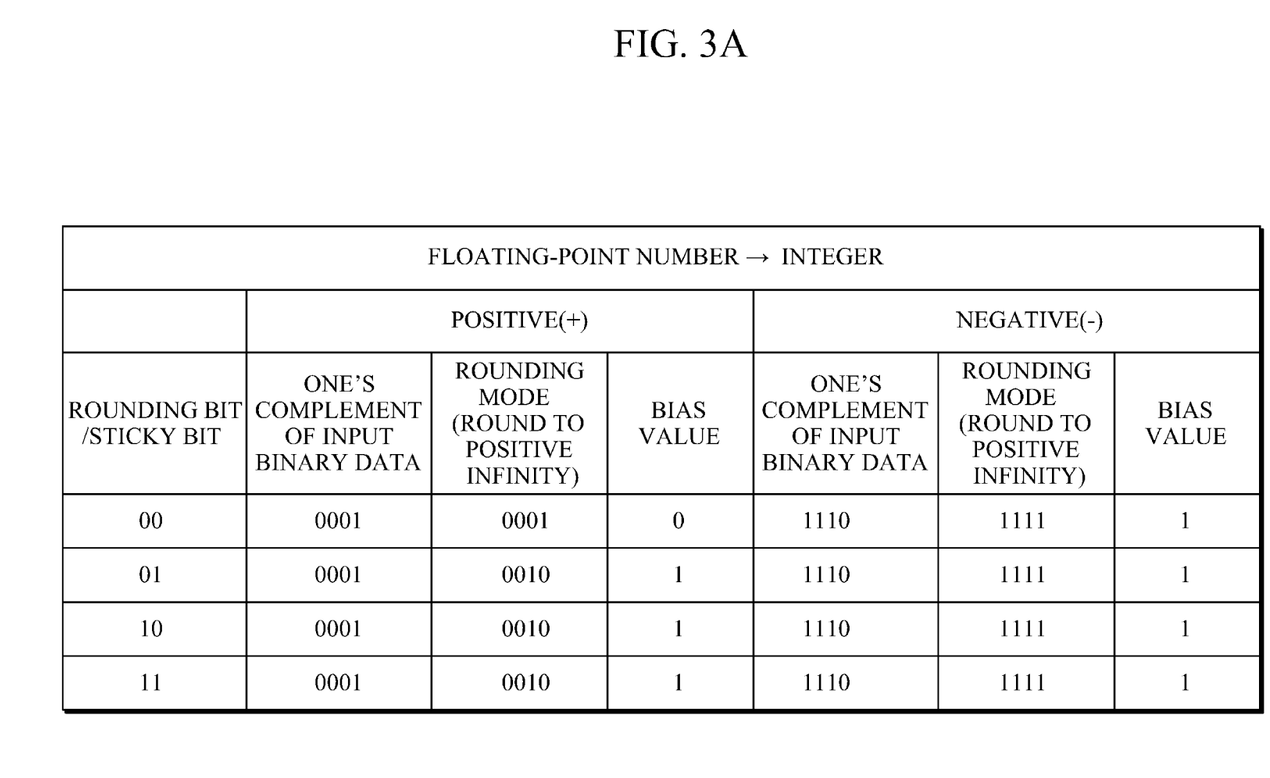
FIGS. 3A through 3H are diagrams illustrating examples of bias value tables for various rounding modes.
Figure 3B:
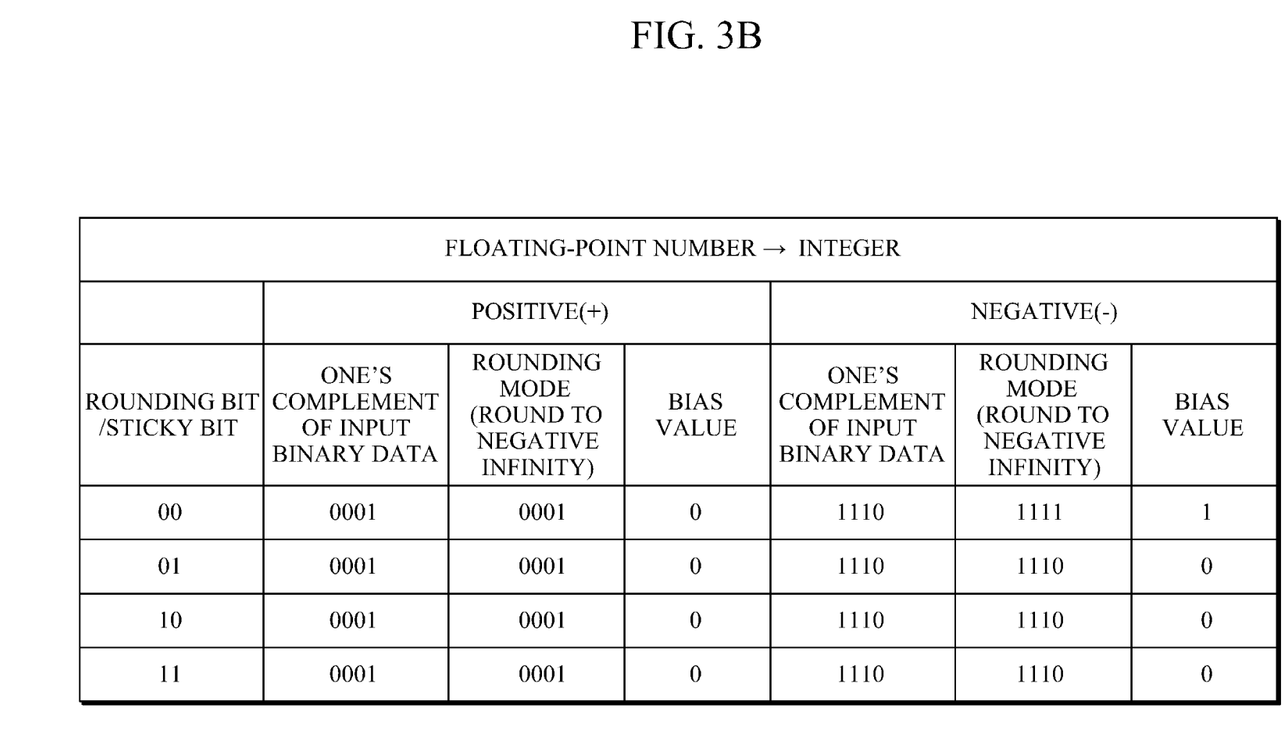
Figure 3C:
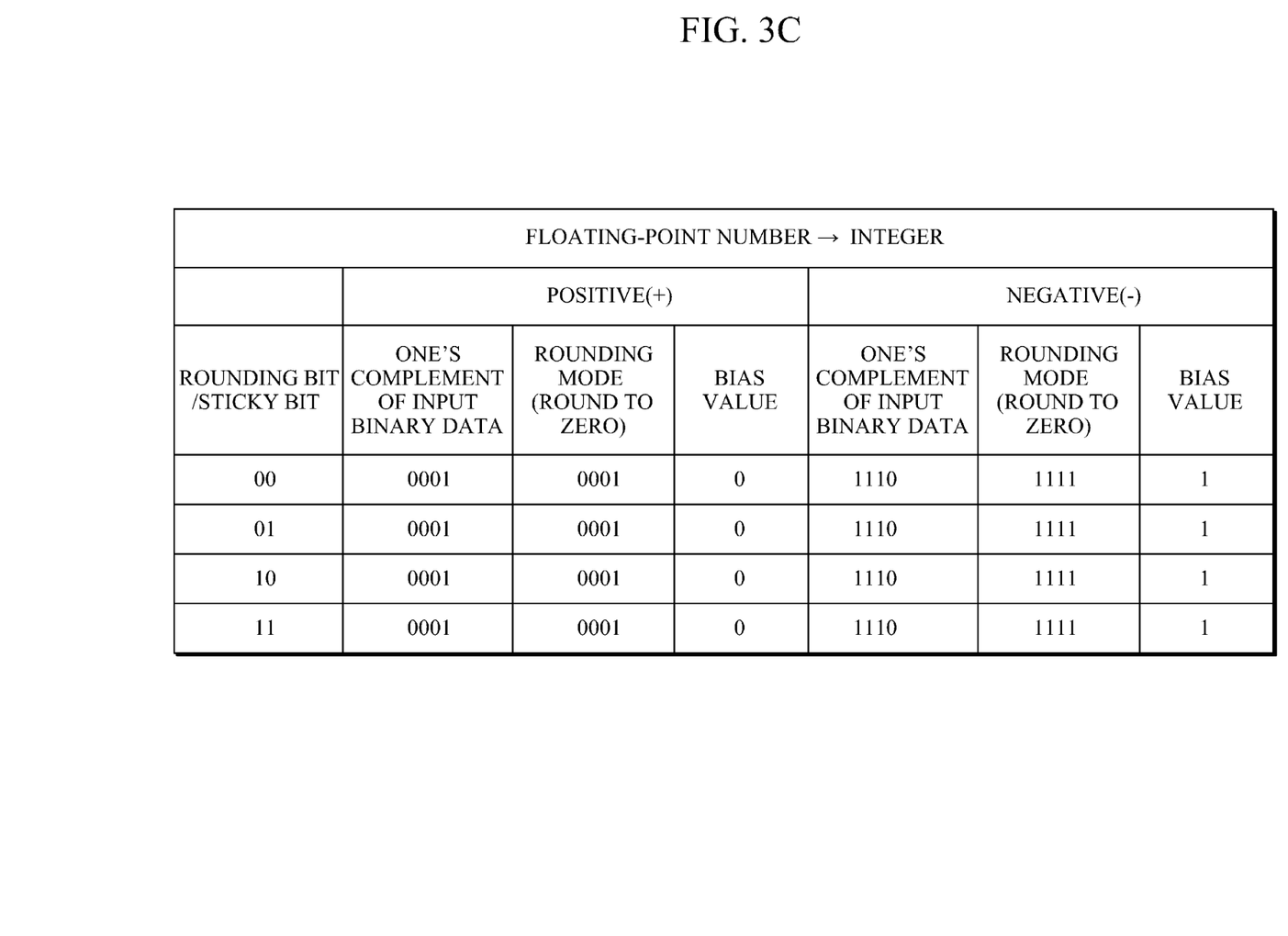
Figure 3D:
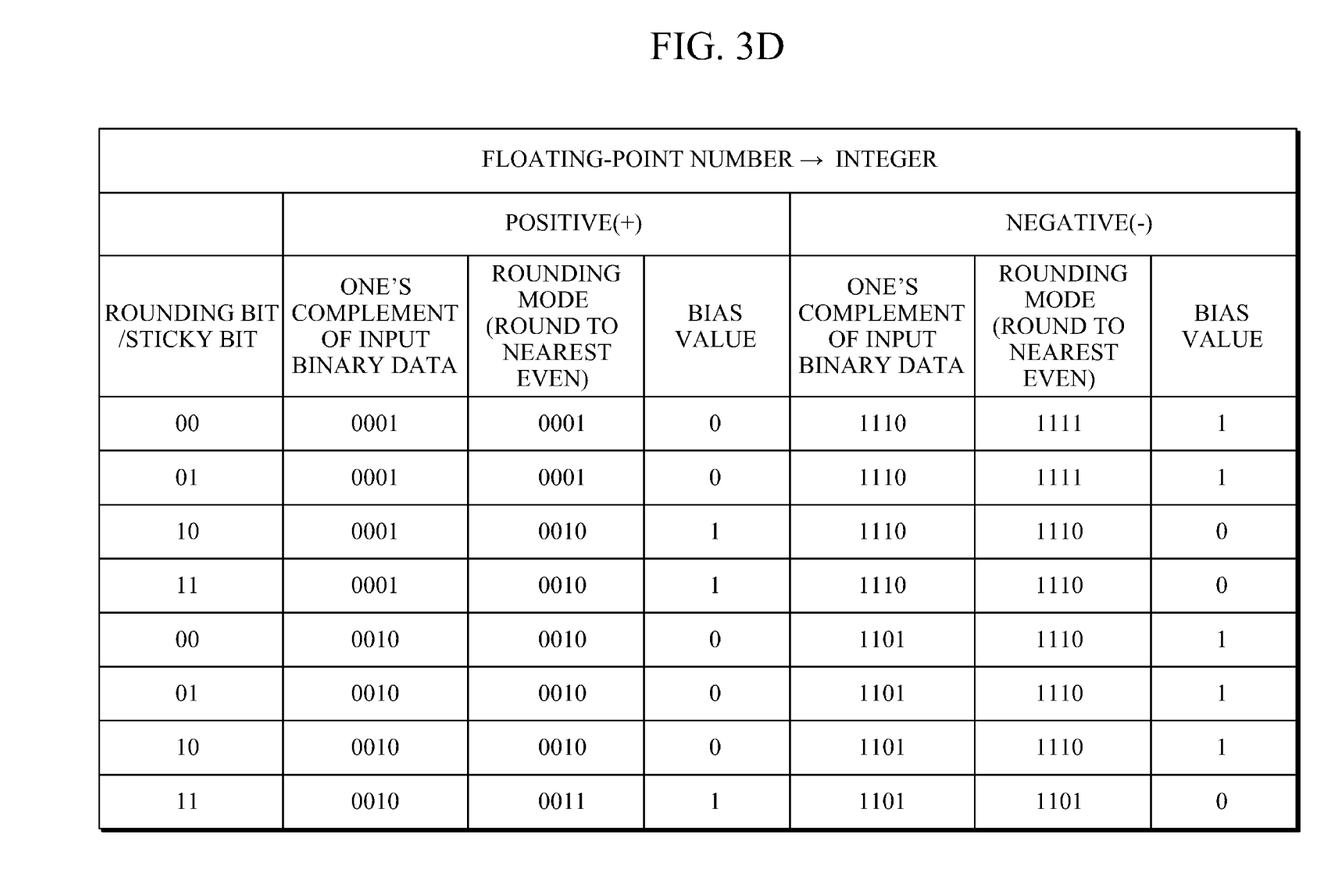
Figure 3E:
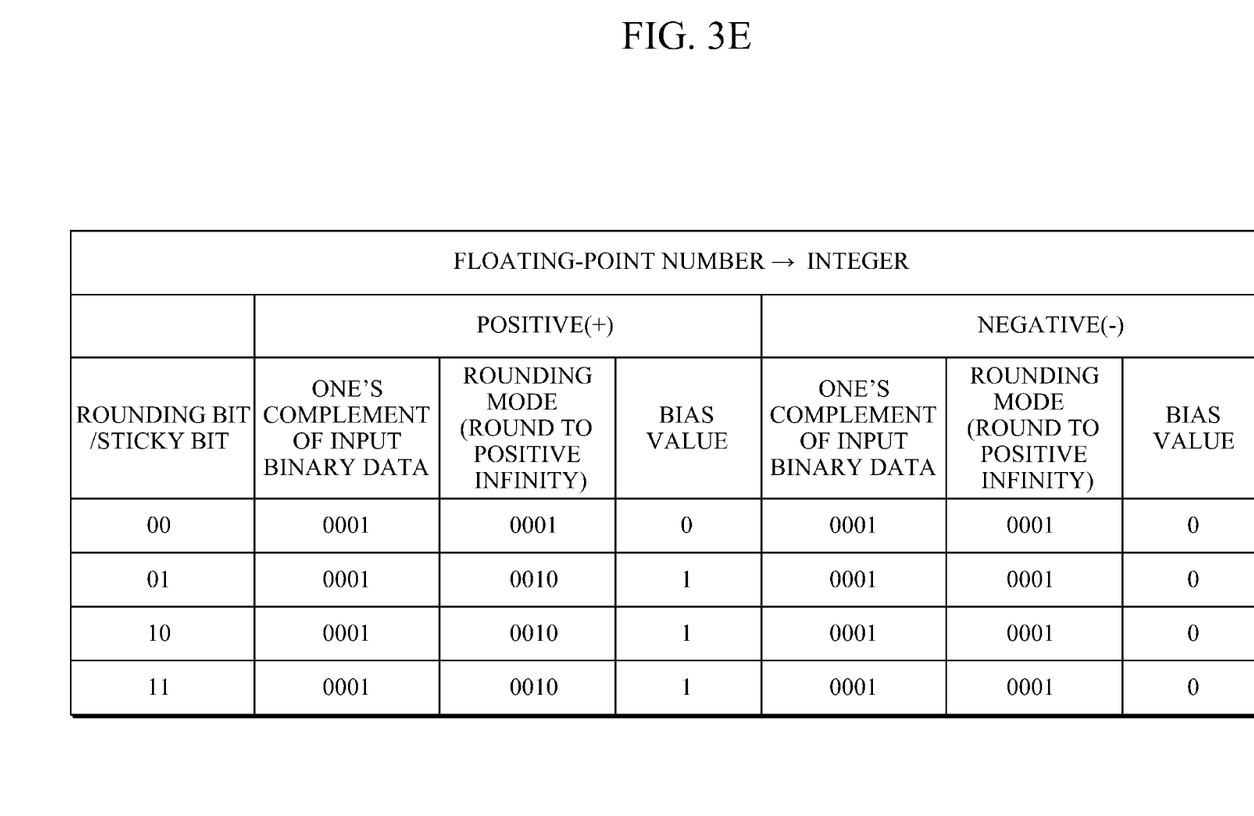

For example, referring to FIG. 3A, if the rounding information of the input binary data indicates that the rounding and sticky bits of the input binary data are 10, that the input binary data is a positive number, and that the rounding mode of the input binary data is the 'round to positive infinity' mode, the bias value for the input binary data may be one. Therefore, the input binary data may be converted into a one's complement number of 0001 by the data converter 110, and may then be converted into a two's complement number of 0010 obtained by adding the bias value of 1 to the one's complement number of 0001.

FIGS. 3E through 3H illustrate examples of bias value tables for reference in the conversion of the input binary data from an integer to a floating-point number for the 'round to positive infinity,' 'round to negative infinity,' 'round to zero,' and 'round to nearest even' modes, respectively.

Figure 3F:
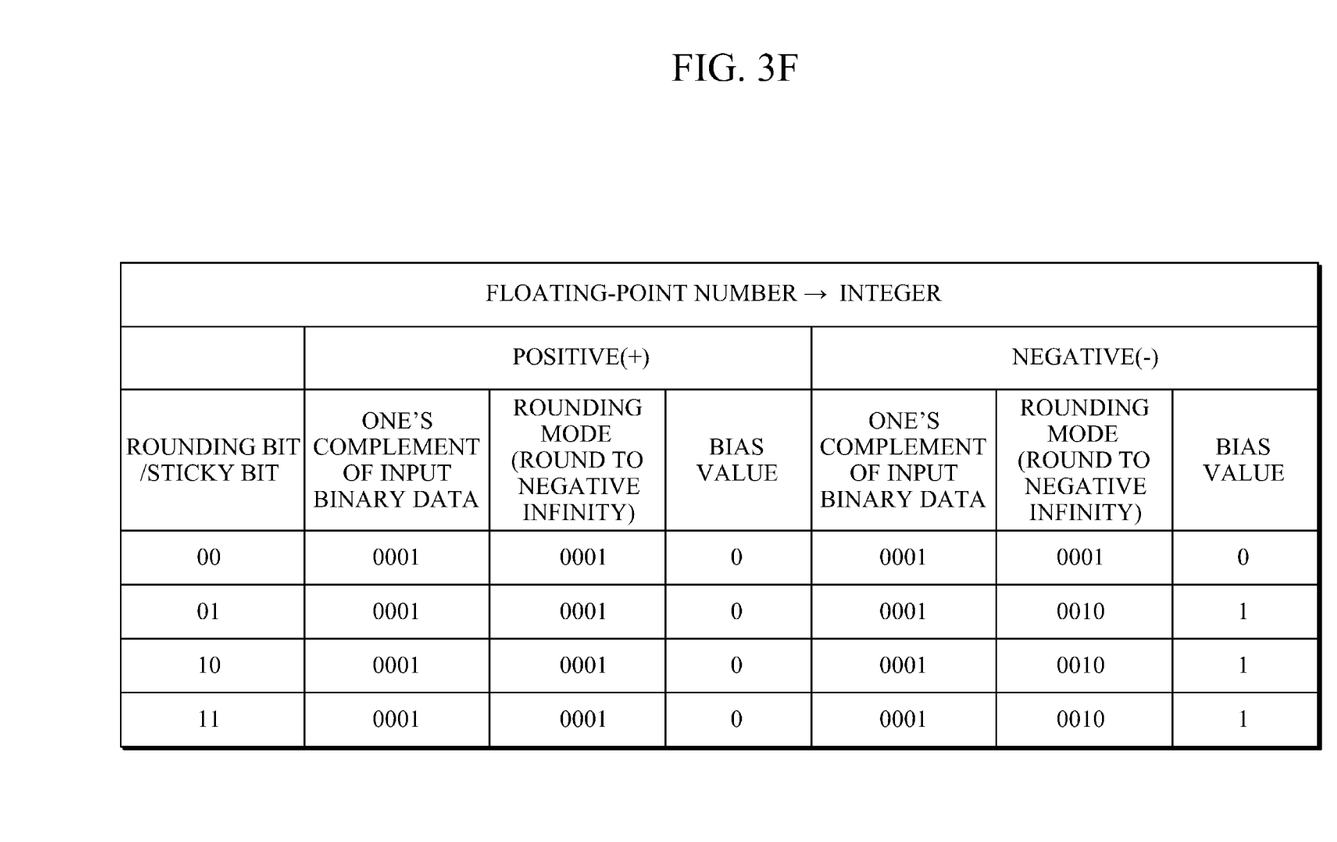
Figure 3G:
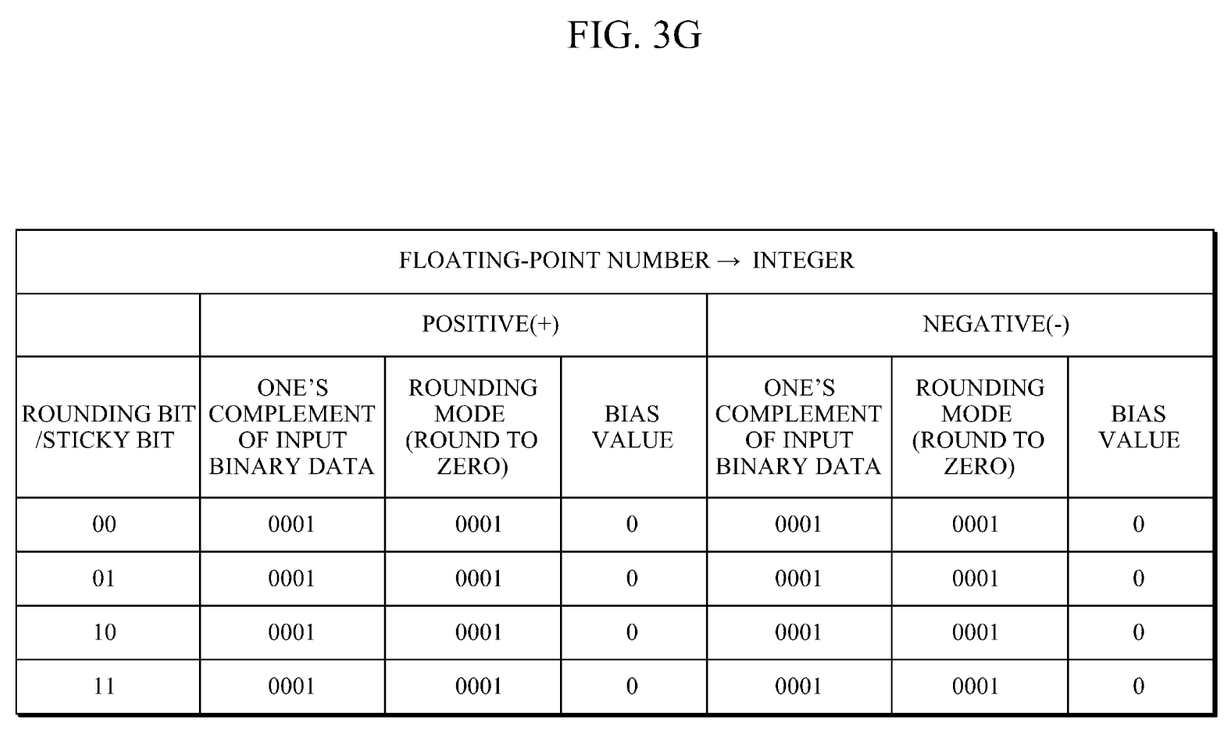
Figure 3H:
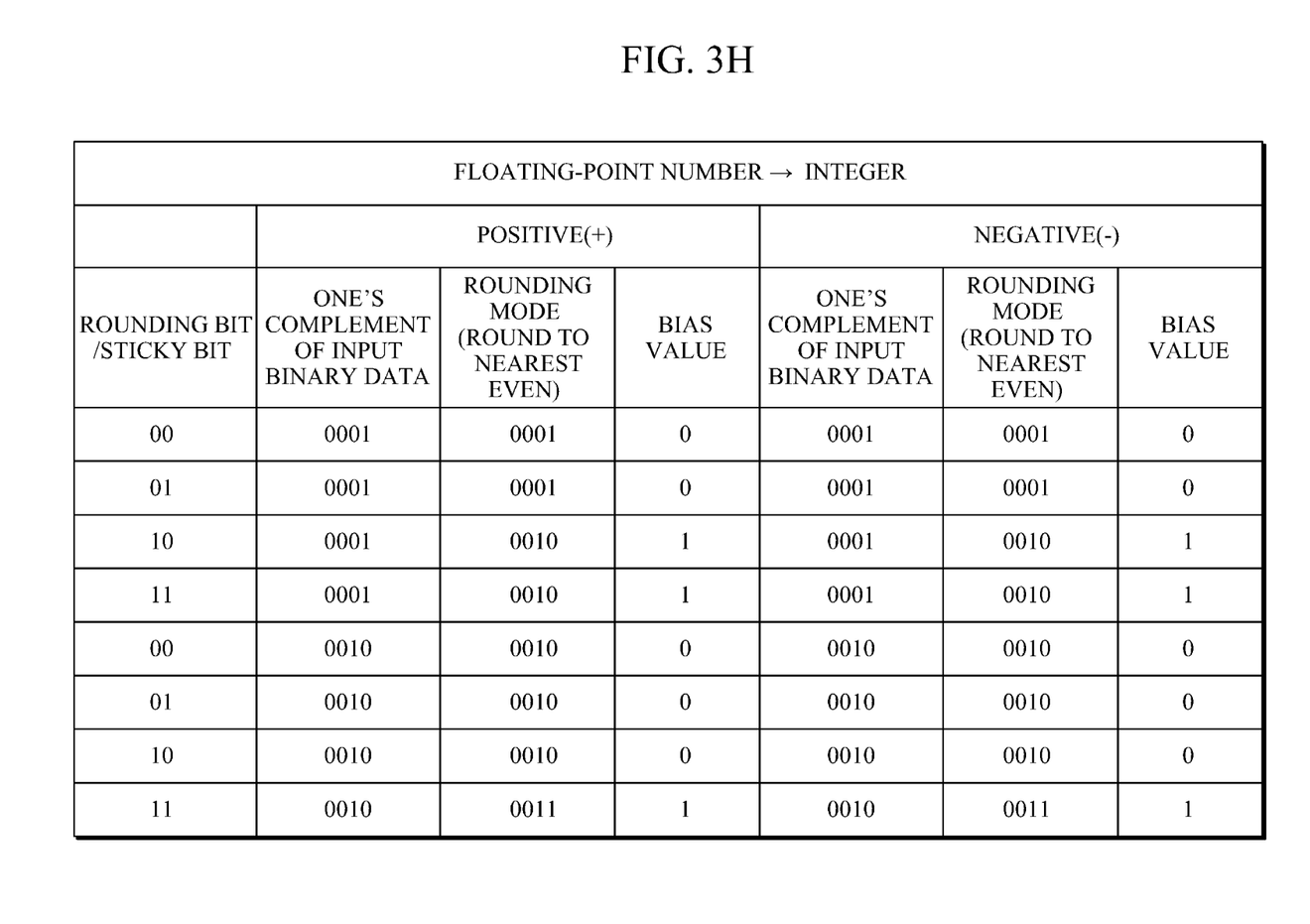

For example, referring to FIG. 3F, if the rounding information of the input binary data indicates that the rounding and sticky bits of the input binary data are 11, that the input binary data is a negative number, and that the rounding mode of the input binary data is the 'round to negative infinity' mode, the bias value for the input binary data may be one. Therefore, the input binary data may be rounded up, and may be converted into a one's complement number of 0001 by the data converter 110, and may then be converted into a two's complement number of 0010 obtained by adding the bias value of 1 to the one's complement number of 0001.

Referring back to FIG. 1, the adder 150 includes a logic device that adds two input values together. The adder 150 is connected to the data converter 110 and the bias value generator 130. Therefore, the adder 150 may receive two values of input data: one from the data converter 110, and the other from the bias value generator 130.

The apparatus 100 is characterized by including only one adder 150. Conventionally, two adders (i.e., one adder for adding one to binary data in a case in which the binary data is rounded up, and the other for converting the one's complement of the binary data into a two's complement number) are required to convert binary data in a typical apparatus. However, since, in the apparatus 100, the bias value generator 130 generates a bias value that is necessary for converting the input binary data into a two's complement number by taking into consideration whether the input binary data has been rounded up, the adder 150 can generate a two's complement number simply by adding a one's complement number provided by the data converter 110 and the bias value provided by the bias value generator 130. Thus, the apparatus 100 requires only one adder, i.e., the adder 150 to convert the input binary data.

The input binary data is also input into the overflow information generator 170. The overflow information generator 170 determines whether overflow has occurred during the conversion of the input binary data. The overflow information generator 170 in the example illustrated in FIG. 1 includes a bit determiner 171 and an overflow determiner 173. The internal precision of the bit determiner 171 includes a number of bits whose values are all one. The bit determiner 171 adds the bits whose values are all 1 to the input binary data. The overflow determiner 173 is connected to the bit determiner 171 and the rounding information generator 131. The overflow determiner 173 determines whether overflow has occurred during the conversion of the input binary data.

More specifically, if the input binary data is a floating-point number, a positive integer, or a fixed-point number, and the bits of the input binary data are all one, the rounding up of the input binary data exceeds a maximum number of bits that can be represented, and, thus, overflow occurs. On the other hand, if the input binary data is a negative integer or a fixed-point number, overflow does not occur even when the bits of the input binary data are all one. In this manner, the overflow determiner 173 may determine whether overflow has occurred during the conversion of the input binary data.

The overflow information generator 170 performs post-normalization. Normalization is the process of aligning the positions of bits of data. Generally, normalization is performed twice, once before and once during the conversion of data. The overflow information generator 170 outputs overflow information indicating whether overflow has occurred during the conversion of the input binary data, and also outputs overflow data whose bits are all zero if it is determined that overflow has occurred during the conversion of the input binary data.

The final data generator 190 may include a multiplexer selecting one of multiple input data values. The final data generator 190 may be connected to the adder 150 and the overflow information generator 170. The final data generator 190 may receive the overflow information and the overflow data from the overflow information generator 170. Also, the final data generator 190 may receive the two's complement number provided by the adder 150.

If it is determined that no overflow has occurred during the conversion of the input binary data, the final data generator 190 may output the two's complement number provided by the adder 150 as final data. On the other hand, if it is determined that overflow has occurred during the conversion of the input binary data, the final data generator 190 may output the overflow data provided by the overflow information generator 170 as the final data.

Figure 4:
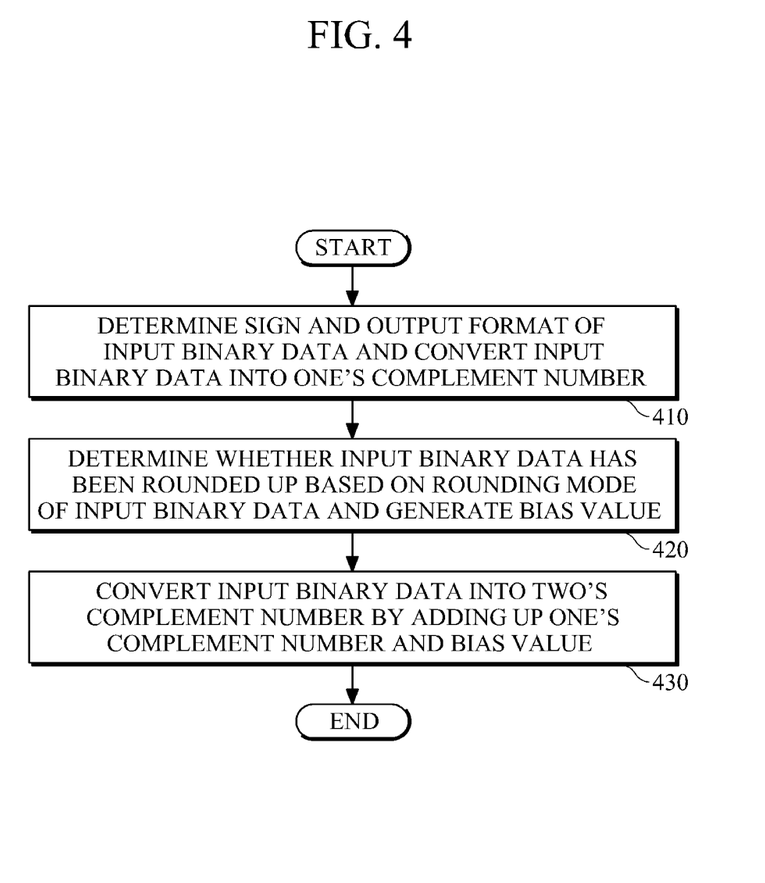
FIG. 4 is a flowchart illustrating an example of a method of converting data between a floating-point number and an integer.

FIG. 4 illustrates an example of a method of converting data between a floating-point number and an integer. Referring to FIG. 4, the sign and the output format of input binary data are determined, and the input binary data is converted into a one's complement number in operation 410. The input binary data may have the internal precision illustrated in FIG. 2. In this case, the sign of the input binary data may be determined based on the most significant bit of the input binary data. The output format of the input binary data may be a floating-point format or an integer format (or a fixed-point format).

The input binary data may be converted into a one's complement number if the output format of the input binary data is a negative integer format. Otherwise, the conversion of the input binary data into a one's complement number may not be performed.

Thereafter, in operation 420, it is determined whether the input binary data has been rounded up based on the rounding mode of the input binary data, and a bias value is generated based on the results of the determination. More specifically, the rounding mode of the input binary data may be determined in advance, and it may be determined whether the input binary data has been rounded up based on the sign and the rounding and sticky bits of the input binary data. The bias value may be generated based on rounding information on the input binary data.

Thereafter, in operation 430, the one's complement number obtained in operation 410 and the bias value obtained in operation 420 are added together, thereby converting the input binary data into a two's complement number.

In short, the input binary data can be converted into a two's complement number obtained by converting the input binary data into a one's complement number, and adding a bias value obtained based on the rounding mode of the input binary data to the one's complement number.

The processes, functions, methods, and/or software described herein may be recorded, stored, or fixed in one or more computer-readable storage media that includes program instructions to be implemented by a computer to cause a processor to execute or perform the program instructions. The media may also include, alone or in combination with the program instructions, data files, data structures, and the like. The media and program instructions may be those specially designed and constructed, or they may be of the kind well-known and available to those having skill in the computer software arts. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The described hardware devices may be configured to act as one or more software modules in order to perform the operations and methods described above, or vice versa. In addition, a computer-readable storage medium may be distributed among computer systems connected through a network and computer-readable codes or program instructions may be stored and executed in a decentralized manner.

A computing system or a computer may include a microprocessor that is electrically connected with a bus, a user interface, and a memory controller. It may further include a flash memory device. The flash memory device may store N-bit data via the memory controller. The N-bit data is processed or will be processed by the microprocessor and N may be 1 or an integer greater than 1. Where the computing system or computer is a mobile apparatus, a battery may be additionally provided to supply operation voltage of the computing system or computer.

It should be apparent to those of ordinary skill in the art that the computing system or computer may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An apparatus for converting data between a floating-point number and an integer, comprising:
   a data converter configured to determine a sign of input binary data and an output format to which to convert the input binary data and convert the input binary data into a one's complement number based on the sign and the output format of the input binary data;
   a bias value generator configured to determine whether the input binary data has been rounded up based on a rounding mode of the input binary data and generate a bias value accordingly; and
   an adder configured to convert the input binary data into a two's complement number by adding the one's complement number and the bias value.

2. The apparatus of claim 1, wherein the data converter is further configured to convert the input binary data into the one's complement number in response to the output format of the input binary data being a negative integer format.

3. The apparatus of claim 1, wherein the bias value generator comprises:
   a rounding information generator configured to generate rounding information on the input binary data based on the sign, the output format, and the rounding mode of the input binary data and rounding and sticky bits of the input binary data; and a bias value calculator configured to calculate the bias value based on the rounding information.

4. The apparatus of claim 3, further comprising an overflow information generator configured to generate overflow information indicating whether overflow has occurred during the conversion of the input binary data.

5. The apparatus of claim 4, wherein the overflow information generator comprises:
a bit determiner configured to determine whether bits of the input binary data are all one; and
an overflow determiner configured to determine whether overflow has occurred based on values of the bits of the input binary data and the rounding information.

6. The apparatus of claim 4, further comprising a final data generator configured to generate final data based on the two's complement number and the overflow information.

7. The apparatus of claim 1, wherein the input binary data is 32-bit or 64-bit binary data.

8. A method of converting data between a floating-point number and an integer using a processor, comprising:
determining, using the processor, a sign of input binary data and an output format to which to convert the input binary data and convert the input binary data into a one's complement number based on the sign and the output format of the input binary data;
determining, using the processor, whether the input binary data has been rounded up based on a rounding mode of the input binary data and generating a bias value accordingly; and
converting, using the processor, the input binary data into a two's complement number by adding the one's complement number and the bias value.

9. The method of claim 8, wherein the calculating the bias value comprises:
generating, using the processor, rounding information on the input binary data based on the sign, the output format, and the rounding mode of the input binary data and rounding and sticky bits of the input binary data; and
calculating, using the processor, the bias value based on the rounding information.

10. The method of claim 9, further comprising generating, using the processor, overflow information indicating whether overflow has occurred during the conversion of the input binary data.

11. The method of claim 10, wherein the generating the overflow information comprises:
determining, using the processor, whether bits of the input binary data are all one; and
determining, using the processor, whether overflow has occurred based on values of the bits of the input binary data and the rounding information.

12. The method of claim 10, further comprising generating, using the processor, final data based on the two's complement number and the overflow information.

13. An apparatus to convert input binary data, comprising:
a data converter configured to convert the input binary data into a one's complement number;
a bias value generator configured to generate a bias value of the input binary data, wherein the bias value generator determines whether the input binary data has been rounded up based on a rounding mode of the input binary data, and generates the bias value accordingly; and
an adder configured to add the one's complement number and the bias value to obtain a two's complement number.

14. The apparatus of claim 13, wherein the data converter converts the input binary data into the one's complement number according to a sign of the input binary data and an output format to which to convert the input binary data.

15. The apparatus of claim 13, wherein the rounding mode is round to nearest, round to zero, round to positive infinity, or round to negative infinity.

16. A method of converting input binary data using a processor, comprising:
converting, using the processor, the input binary data into a one's complement number;
generating, using the processor, a bias value of the input binary data, wherein the generating of the bias value comprises determining, using the processor, whether the input binary data has been rounded up based on a rounding mode of the input binary data, and generating the bias value accordingly; and
adding, using the processor, the one's complement number and the bias value to obtain a two's complement number.

17. The method of claim 16, wherein the converting of the input binary data into the one's complement number is executed according to a sign of the input binary data and an output format to which to convert the input binary data.

18. The method of claim 16, wherein the rounding mode is round to nearest, round to zero, round to positive infinity, or round to negative infinity.

* * * * *